United States Patent
Piwczyk et al.

(10) Patent No.: US 6,376,797 B1
(45) Date of Patent: Apr. 23, 2002

(54) LASER CUTTING OF SEMICONDUCTOR MATERIALS

(75) Inventors: Bernhard P. Piwczyk, Dunbarton, NH (US); Juris P. Kalejs, Wellesley, MA (US)

(73) Assignee: ASE Americas, Inc., Billerica, MS (US)

( * ) Notice: Subject to any disclaimer, the term of this patent is extended or adjusted under 35 U.S.C. 154(b) by 0 days.

(21) Appl. No.: 09/626,708

(22) Filed: Jul. 26, 2000

(51) Int. Cl.[7] .............................................. B23K 26/38
(52) U.S. Cl. ............................ 219/121.72; 219/121.84; 219/121.86
(58) Field of Search ....................... 219/121.67, 121.68, 219/121.69, 121.7, 121.71, 121.72, 121.84, 121.86

(56) References Cited

U.S. PATENT DOCUMENTS

| | | | | |
|---|---|---|---|---|
| 4,532,401 A | * | 7/1985 | Shiozaki et al. ....... | 219/121.68 |
| 4,728,771 A | | 3/1988 | Sartorio ...................... | 219/121 |
| 4,871,897 A | | 10/1989 | Nielsen .................. | 219/121.67 |
| 5,083,066 A | | 1/1992 | Stroud .................... | 219/121.71 |
| 5,168,143 A | * | 12/1992 | Kobsa et al. .......... | 219/121.72 |
| 5,220,149 A | | 6/1993 | Neidhardt .............. | 219/121.67 |
| 5,227,604 A | * | 7/1993 | Freedman .............. | 219/121.63 |
| 5,374,803 A | | 12/1994 | Yamada .................. | 219/121.72 |
| 5,869,803 A | * | 2/1999 | Noguchi et al. ........ | 219/121.62 |
| 6,163,010 A | * | 12/2000 | Kobsa .................... | 219/121.61 |
| 6,252,197 B1 | * | 6/2001 | Hoekstra et al. ........ | 219/121.84 |

* cited by examiner

Primary Examiner—Samuel M. Heinrich
(74) Attorney, Agent, or Firm—Pandiscio & Pandiscio

(57) ABSTRACT

A method of cutting thin bodies of silicon so as to minimize edge damage comprises traversing said bodies with the beam of a pulsed laser in a vacuum or in the presence of forming gas or a noble gas.

26 Claims, 7 Drawing Sheets

LASER CUTTING OF SEMICONDUCTOR MATERIALS

This invention was made under Subcontract No. ZAX-8-17647-10, which is a subcontract under U.S. Prime Contract No. DE-AC36-83CH10093.

1. Field of the Invention

This invention relates to the use of lasers for cutting semiconductor materials and more particularly to the laser cutting of EFG-grown material.

2. Background of the invention

The EFG method of growing shaped crystalline materials from a melt, is well known, as exemplified by U.S. Pat. Nos. 4,937,053, 5,102,494 and 5,558,712. The use of EFG materials in fabricating photovoltaic cells also is well known, as exemplified by U.S. Pat. Nos. 4,751,191, 5,698,451, 5,106,763 and 5,151,377. It has been the practice to use the EFG method to grow hollow polygonal bodies of a doped semiconductor material, e.g., octagons of phosphorous-doped silicon, and to use a laser to subdivide those bodies into rectangular wafers or blanks for use in making photovoltaic cells. More recent efforts have been directed to growing large diameter, thin wall cylinders of silicon, e.g., cylinders with a diameter of approximately 50 cm and a wall thickness of 100 to 700 $\mu$m (microns).

Laser cutting of a material involves absorption of laser energy within the material, resulting in a localized temperature increase, melting and vaporizing of the material and transport of the melted and vaporized material away from the body being cut. The development of existing technology for cutting wafers out of hollow EFG-grown silicon bodies has been driven by the need to maximize cutting speed, which has lead to a search for lasers with the highest available average power. Heretofore the cutting up of hollow silicon bodies into wafers has been accomplished in air using conventional industrial lasers such as conventional Nd:YAG and $CO_2$ lasers with average power levels of about 100–500 watts ("W"). Those lasers are similar in their cutting action in that they are operated with relatively long pulse lengths, about 300 and 500 microseconds ($\mu$s) respectively, and the cutting proceeds with a predominantly melting mechanism. These prior methods of laser cutting silicon bodies have cutting speeds in the order of 25–50 mm/sec. for 300 $\mu$m thick silicon. Moreover, the same prior methods of laser cutting the brittle EFG-grown silicon bodies result in laser-induced damage to the edges of the silicon wafers.

Laser-induced edge damage to the silicon wafers is the result of changes in the physical material properties where heating has occurred. The material depth to which these changes are detectable is called the heat-affected zone ("HAZ"). The defects in the HAZ are of two types—microcracks and deposited debris ("slag"). The microcracks, which usually are numerous, commence at and generally propagate normal to the cut edges and then turn by about 90 degrees so as to extend parallel to the cut edges. By way of illustration, when cutting silicon in air with a thickness of 300 $\mu$m using a Nd:YAG laser with a pulse duration of 0.5 milliseconds (msec), a pulse energy of 500 millijoules (mJ) and a Gaussian spot with a beam diameter of approximately 150–200 $\mu$m, the microcracks may extend up to 50 $\mu$m away from the cut edges. These microcracks are highly undesirable since they result in mechanical weakness of the laser cut wafers. The slag consists primarily of silicon which has resolidified from the molten and volatilized states and $SiO_2$ (when air is present in the cutting zone). The deposited slag contributes to the weakening of the edges of the cut wafers.

The damaged edge material needs to be removed by chemical etching before the cut wafers can be processed to manufacture photovoltaic cells. The deeper the HAZ, the more material must be removed at the edges of the wafers. Unfortunately the occurrence of edge damage has resulted in a reduction in the yield of acceptable wafers for solar cell fabrication purposes and also in increased costs due to the need to remove damaged edge material from the wafers before commencing the several processes required to convert the wafers to solar cells or other devices.

The critical laser characteristics influencing the laser beam interaction with crystalline silicon and the extent of the HAZ are laser power and the variations of the absorption coefficient with wavelength, temperature, peak laser power, and gas composition. These factors impact on the cutting speed limits as well as on the mechanism of heat transport and subsequent HAZ formation and edge damage generation. However, in striving to reduce edge damage, the basic requirement of maximizing laser power so as to increase the cutting speed must be coupled with limiting the heat input to the silicon material, since the heat input to the material surrounding the laser cut determines the extent of the HAZ and the occurrence and length of the microcracks. Depending on the laser beam wavelength, the pulse length must be sufficient so that enough energy is initially retained in the silicon crystalline material to heat it above about 600° C. to attain melting of the silicon. The laser pulse energy must be maintained near the melting threshold to minimize the HAZ.

Damage free and rapid cutting of silicon using laser energy has remained an elusive but necessary goal in the effort to achieve high yields at the various stages in the process of converting the silicon wafers into photovoltaic cells or other semiconductor devices and to reduce manufacturing costs.

OBJECTS AND SUMMARY OF THE INVENTION

A primary object of this invention is to provide a new and improved method of cutting crystalline materials with a laser.

Another object of this invention is to provide a new and improved method of cutting semiconductor bodies with a laser so as to produce wafers for use in making solar cells or other solid state semiconductor devices.

A further object is to provide an improved method of cutting crystalline materials with a laser so as to reduce edge damage.

Still another object is to enhance the speed of laser cutting a crystalline material such as silicon.

A more specific object is to provide an improved method of cutting a thin silicon body with a laser at a rapid rate with minimal occurrence of micro-cracks or other damage at the edges of the cut material.

Another specific object is to provide an improved method of laser-cutting EFG-grown hollow silicon bodies into rectangular wafers or blanks, with the cutting being accomplished at optimum speed and with a reduced number of micro-cracks at the edges of the wafers.

The foregoing objects, and other objects that are rendered obvious by the following detailed description, are achieved by cutting semiconductor material with a laser in a selected a vacuum or a non-oxygen atmosphere. More particularly, the laser cutting is accomplished in a vacuum or in the presence of one or more gases from the group comprising forming gas and the noble gases (He, Ne, AR and Kr). Other features and advantages of the invention are disclosed in or rendered obvious by the following detailed specific description and the accompanying drawings.

THE DRAWINGS

DETAILED DESCRIPTION OF THE INVENTION

Figure 1A:
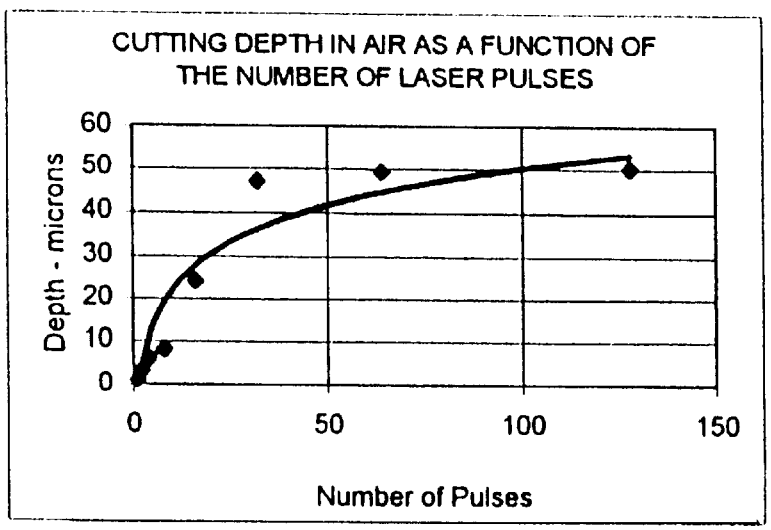
FIGS. 1A–1G are graphical representations comparing the speed of cutting silicon with a Q-switch Nd:YAG laser varies according to the atmosphere in which the cutting is accomplished.
Figure 1B:
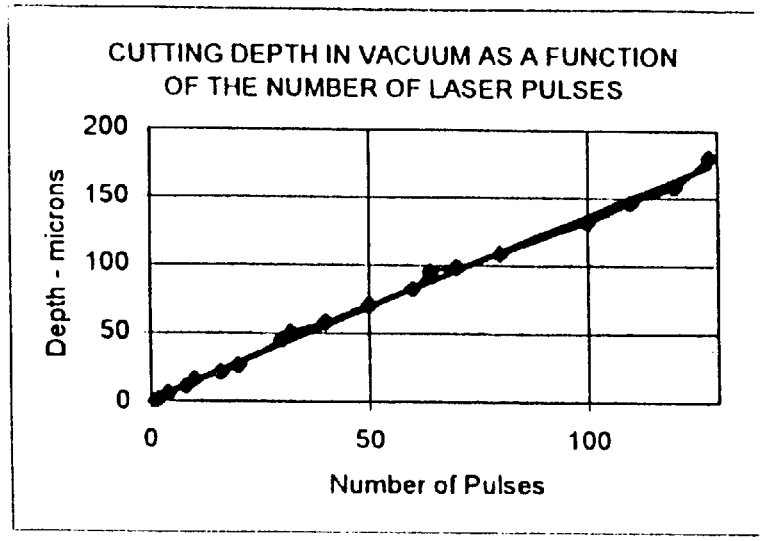

When using a laser to cut silicon or any other material in air, the laser must be operated so as to provide a peak power density at the beam focus that is less than that which will cause the air to break down and form a plasma, which occurs at a power density of approximately $5 \times 10^9$ watts per square centimeter ($W/cm^2$). The formation of plasma consumes substantially all or most of the laser energy, thereby preventing laser cutting since little of the energy reaches the material to be cut. It has been determined from laser cutting in air that, in general, the HAZ becomes smaller for any given material at a peak power density just below that at which air breaks down into a plasma. Nevertheless, as noted above, the laser pulse energy must be maintained near the melting threshold to minimize the HAZ. In this connection it has been determined also that the minimum energy required to melt silicon is about 200 $J/cm^2$ and the minimum energy required to vaporize silicon is about 1000 $J/cm^2$ (for laser beam diameters of the order of 50–200 $\mu$m as is common in practice, the threshold melting and vaporizing energies are about 4 mJ and about 64 mJ per pulse respectively).

Short pulse length lasers (i.e., lasers having a pulse width in the range of tens of nanoseconds or less) are attractive because their average power levels have improved to a range that makes them practical for high speed cutting of silicon wafers, subject to being used so as to minimize edge damage. Such lasers can be adapted to provide a peak power density that approaches the practical limiting value for air breakdown. The efforts to utilize short pulse length lasers for cutting silicon in air have been stimulated by the expectation that the short pulse length laser energy will transfer less heat to the silicon and thereby will decrease the HAZ and damage depth while permitting the energy absorption to be sufficient for the cutting to proceed quickly with a predominantly melting mechanism.

However, problems were observed trying to using short pulse lasers to cut wafers in air at viable rates exceeding 10 mm/sec. Efforts employing a high peak power Q-switched Nd:YAG laser and a short pulse Excimer laser revealed that initially the laser cutting of 300–600 $\mu$m thick EFG-grown silicon tubes in air proceeds very fast over the first 25–50 microns, but then slows down substantially to zero. The use of a copper vapor laser in air also proved to be unsatisfactory, because although the beam penetrates very quickly because of its high pulse repetition rate of 5000–10000 Hz, the kerf cavity created by the laser cutting action is rapidly filled in with $SiO_2$ slag so that the cut edges are glued shut, preventing removal of the wafer. Accordingly until the present invention it was not feasible to use short pulse lasers to cut wafers out of thin crystalline silicon tubes grown by the EFG process even though such lasers are capable of providing peak power density levels sufficient to appreciably exceed the melting threshold and to vaporize the melted silicon.

Studies conducted in the course of making the present invention have also indicated that some form of plasma is found near the surface of the silicon material being cut in air even when the cutting is accomplished with a short pulse length laser at a laser peak power density just below the air plasma breakdown level (approximately $5 \times 10^9$ $W/cm^2$), leading to the possibility that the plasma is due to the presence of volatilized silicon and that the formation of the plasma may cause or contribute to microcrack damage.

The present invention is based on and includes the discovery that the cutting problems normally encountered when cutting silicon with a short pulse length Q-switched Nd:YAG laser could be overcome and the usual microcrack damage substantially eliminated by cutting the silicon material in a vacuum or in a selected gaseous environment consisting substantially of a noble gas (He, Ne, Ar and Kr) or forming gas (90% $N_2$: 10% $H_2$).

A series of cutting experiments were conducted to evaluate the effect of various ambients on laser beam penetration, cutting speed and HAZ-related cutting damage to the test specimens. For the purposes of the test, specimens in the form of 700 micron thick wafers of polished single crystal Czochralski-grown silicon were used for ease of measurement due to their flat polished surfaces. Cutting of the silicon specimens was conducted using a Spectra Physics Model PRO-290 Q-switched Nd:YAG laser having a 50 Hz pulse repetition rate and a 10 ns (nanosecond) pulse duration. The average power output of the laser for the experiments was 65 W. The energy per pulse was 500 mJ and the laser beam was focused to provide a peak power density of $0.9 \times 10^9$ $W/cm^2$, just below the level of $5 \times 10^9$ $W/cm^2$ at which air plasma breakdown occurs. The specimens to be cut were mounted in a chamber which had a window through which the laser beam was directed at the specimens. The chamber was connected to a turbomolecular pump and a gas manifold. The pump and manifold were used to evacuate the chamber and to maintain the vacuum or fill the chamber with various selected gases. The following ambients were tested: air, vacuum, $N_2$, $CH_2F_2$, forming gas (90% $N_2$:10% H2), and the noble gases He, Ne, Ar, and Kr. The chamber was maintained at a pressure of one atmosphere during the cutting in the presence of the foregoing gases.

Depth measurements were made using optical microscopy and measuring depth by critical focusing at the top surface and the bottom of the laser cut trenches. Trenches were cut in the polished wafers by exposing the material to the focused laser beam pulses in increments as follows: 1, 2, 4, 8, 16, 32, 64 128 pulses and measuring the trench depth after each increment. Material damage was examined by metallurgical cross-sectioning and optical microscopy.

FIGS. 1A–1G graphically show the results for material removal in a vacuum and all but two of the various gases listed above. In this connection it should be noted that FIGS. 1A–1G present graphical data only for helium (He) and argon (AR). However, neon (Ne) and krypton (KR) were also tested and showed essentially identical behavior.

Because noble gases appeared to work well, nitrogen was also tested to see if oxygen could be responsible for the poor cutting speed in an air ambient. Forming gas was used to determine if hydrogen could accelerate the cutting speed, and the forming gas turned out to show essentially the same behavior as noble gases. Di-fluoromethane was tested as an ambient to determine if free fluorine radicals produced by laser energy could accelerate the cutting process.

Figure 1C:
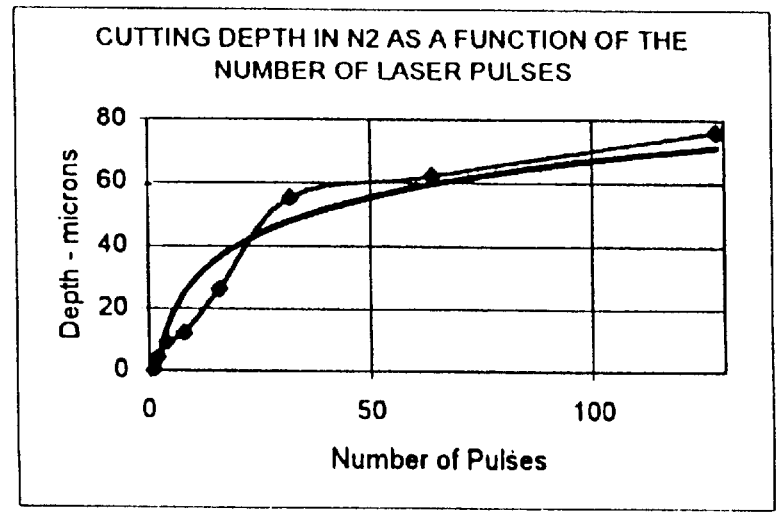
Figure 1D:
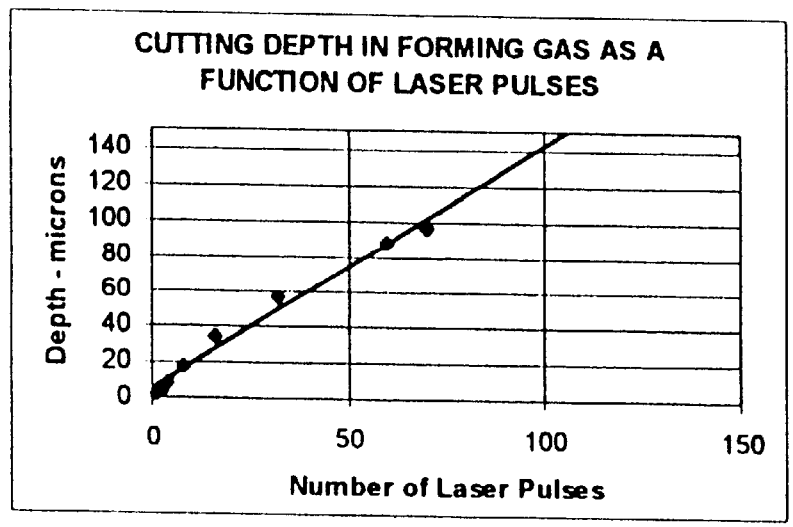
Figure 1E:
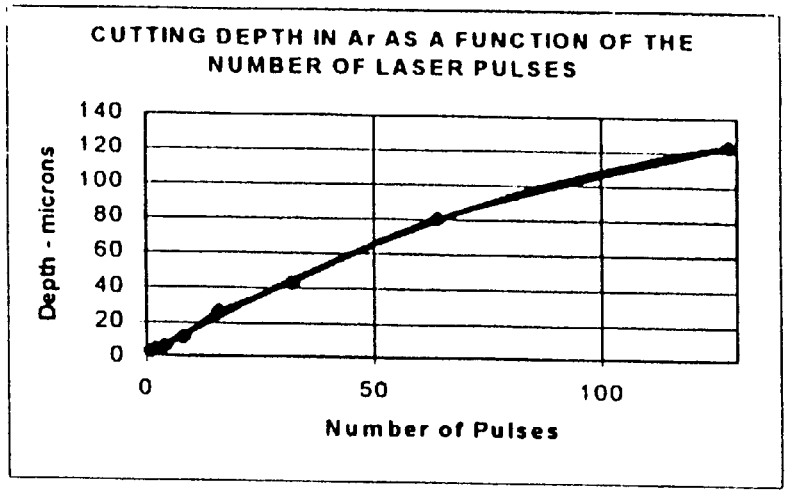
Figure 1F:
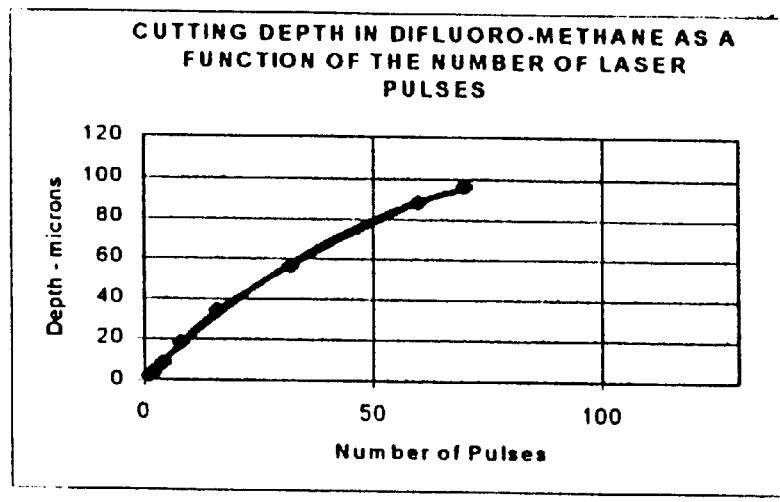
Figure 1G:
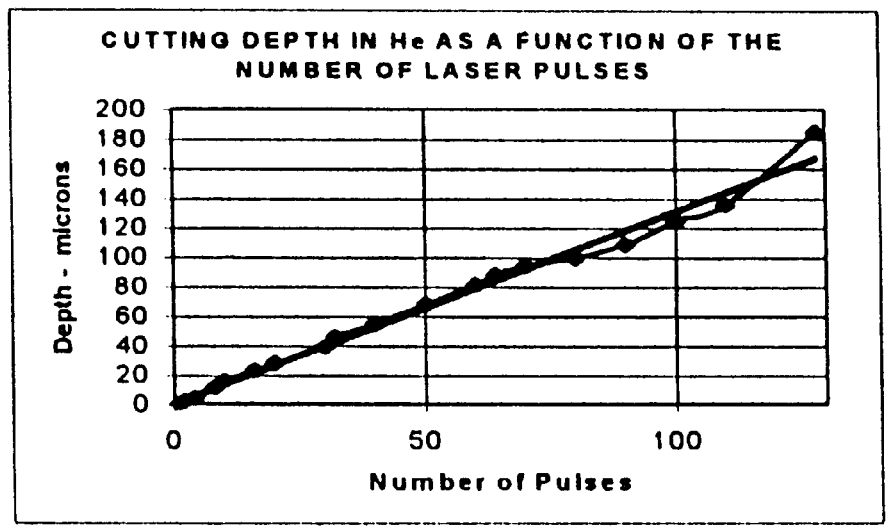

From the data presented in FIGS. 1A–1G, it is readily apparent that all but a vacuum, forming gas and rare gas ambients show a slowing of the beam penetration with increasing depth. A comparison of FIGS. 1A and 1C shows that nitrogen and air have a similar detrimental effect on cutting speed, although with nitrogen the detrimental effect is not quite as pronounced. FIG. 1F shows that the results using difluoromethane were also poor. Vacuum, noble gases and forming gas show essentially the same high material removal rate and a substantially linear removal rate as a function of the number of pulses. The material removal rate remains essentially constant regardless of depth within the boundaries of the experiments. The penetration rates in a vacuum environment and noble gas environments are nearly identical regardless of the atomic weight of the noble gas.

The reason for the improvement in cutting rates is not readily explainable. One possible explanation is delayed onset of plasma in vacuum and inert gases when compared to other ambients. It was noted that a plasma is always formed under the experimental conditions, even in vacuum, since volatilized silicon appears to lead to plasma formation as seen by a bright blue flash near the material surface.

Optical microscopy combined with cleaving and metal-lurgical cross-sectioning was used to determine the shape of the laser cut, the presence of melt or slag and the presence of microcracks. The tests revealed that cutting in a helium environment proceeded without microcracking to a depth of about 200 microns ($\mu$m), with nearly vertical sidewalls except at the very beginning of the cutting action. The bottom of the cut is also "V" shaped and some buildup of slag and silicon is observed at the edges. It was observed also that with a cutting penetration deeper than about 200 microns, buildup of slag is observed at the walls of the kerf (i.e., the cut), thereby restricting beam access at the bottom of the cut and ultimately limiting the thickness which can be cut. Occurrence of microcrack damage was observed beyond the depth of about 200 microns. The cutting rate and the shape of the kerf or cut formed when operating in a vacuum is virtually indistinguishable from the cut that is made in a helium ambient. In contrast, cutting in air produced a kerf that developed as a round "bowl" shape with a significant buildup of slag and a heat affected zone. Cutting in air essentially terminated at a depth of about 50 microns using the Spectra Physics Nd:YAG laser mentioned above. Additional experiments involved cutting in a helium environment open to the atmosphere, where some air could not be excluded. These additional experiments were not quantitative but showed a rapid deterioration of cutting speed, from 3.0 cm/sec down to only about 1 cm/sec for 125 $\mu$m thick wafers, and also a deterioration in kerf quality expressed in terms of slag deposition and oxide formation surrounding the kerf.

Additional experiments were conducted with the same laser and operating conditions using specimens of EFG-grown silicon having a thickness of 125 microns. In this case, it was determined that cutting could be conducted in helium and forming gas at a cutting speed of 3.0 cm/sec without any significant microcrack damage.

For economic and practical reasons, cutting in a noble gas environment such as helium is preferable over cutting in a vacuum. Under current manufacturing practices EFG tubes may measure six feet in length (or even longer) and, in the case of cylinders, more than three feet in diameter. It would normally be necessary to immerse the entire cylinder in a helium filled chamber with the laser beam entering through a window in the chamber. With such an arrangement the chamber would have to be filled with helium for every tube to be cut, unless a load lock including vacuum pumping of the lock is used. Because the expense and complexity of such apparatus is economically prohibitive for the cutting of wafers from an EFG tube for the production of solar cells, other apparatus has been conceived for practicing the invention.

Figure 2:
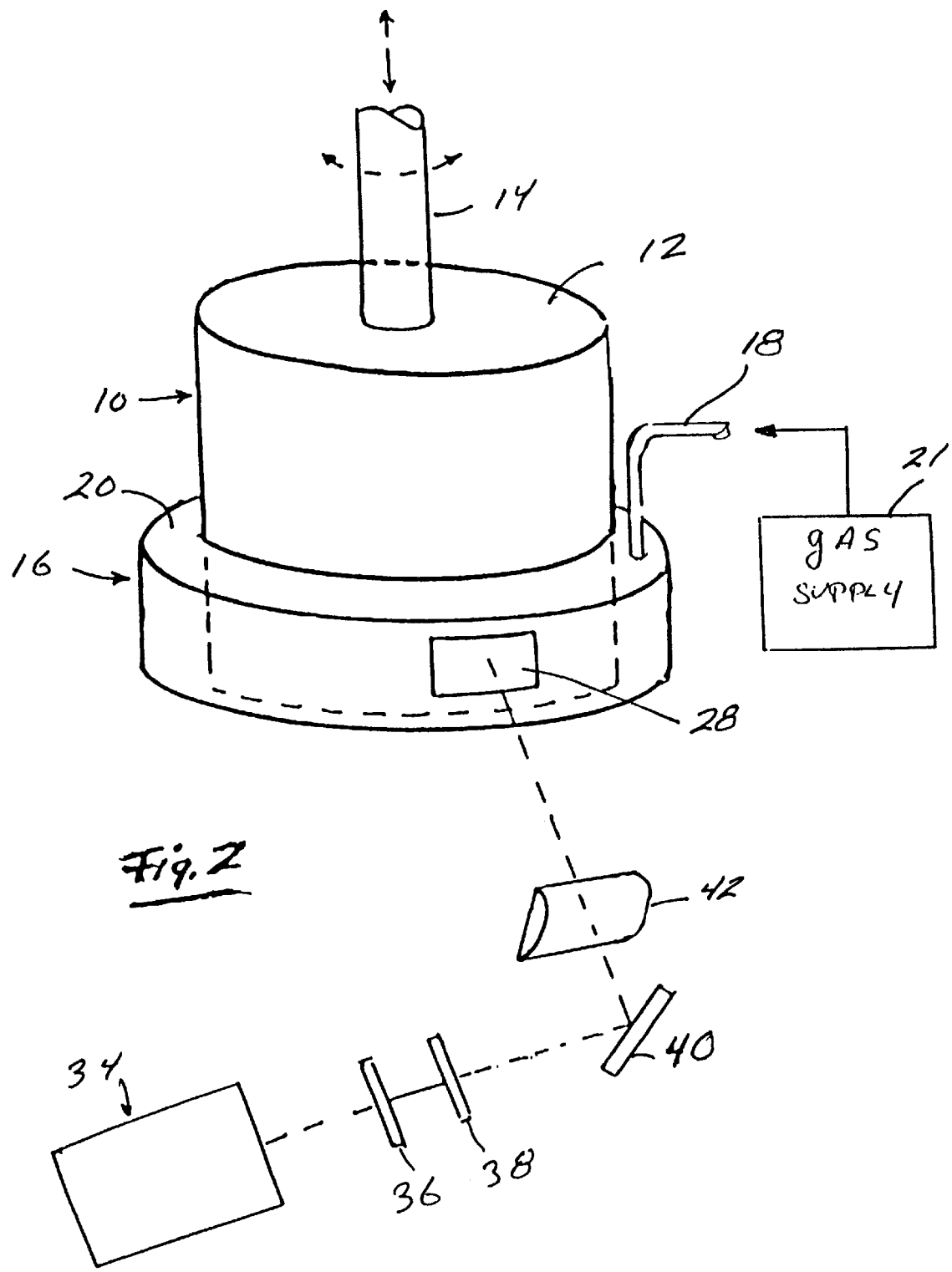
FIG. 2 is a schematic illustration of one form of apparatus for practicing the present invention.
Figure 3:
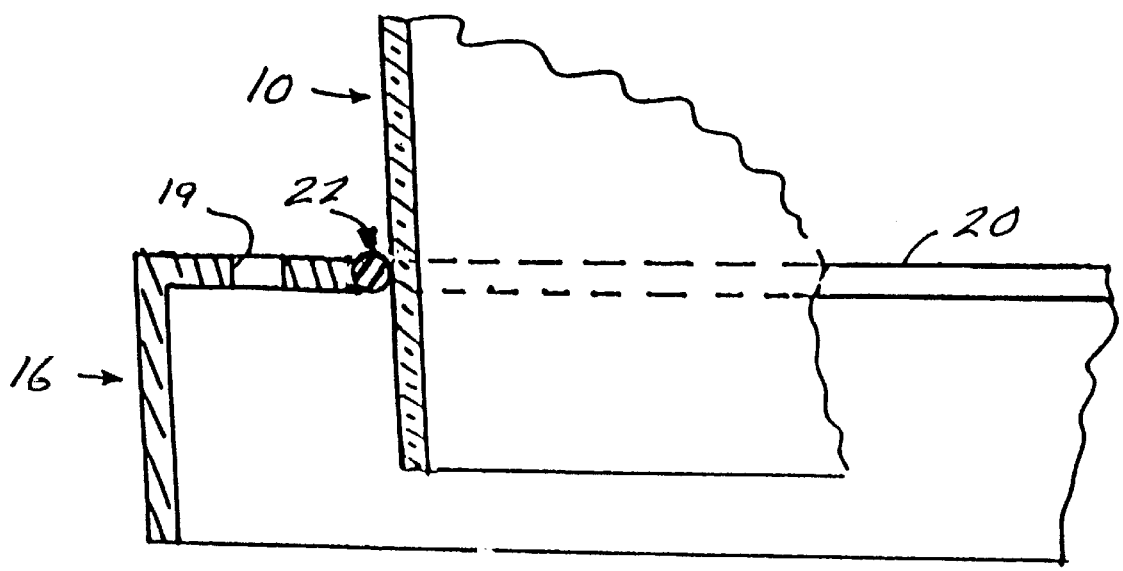
FIG. 3 is a cross-sectional view of a portion of the apparatus of FIG. 2.
Figure 4:
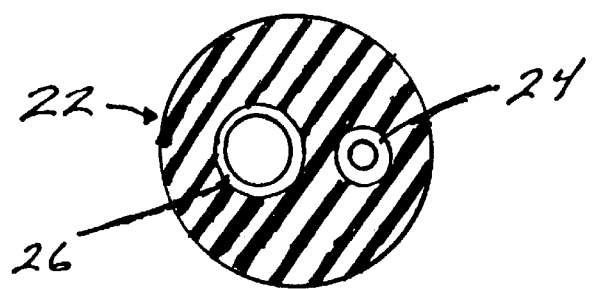
FIG. 4 is a cross-sectional view of the O-ring that forms part of the FIG. 2 apparatus.

FIGS. 2–4 illustrate a preferred form of apparatus for cutting wafers out of an EFG-grown hollow tube of silicon in the presence of a selected gas atmosphere. It should be noted that for convenience of illustration, the wall thickness of the silicon tube is exaggerated in FIG. 3. FIG. 2 shows a short section of an EFG-grown cylindrical tube or cylinder 10 that is attached to a supporting disk 12 that is attached to a shaft 14. The latter is mounted for up and down vertical and rotational movement by a suitable drive mechanism (not shown). The tube section 10 is surrounded by a collar 16 which has an L-shaped cross-sectional shape, being open to the ambient at the bottom as shown by FIG. 3. The inner space of the collar is flooded with a gas selected according to the present invention, preferably helium, via a tube 18 that is mounted in an opening 19 in the upper side 20 of the collar and is connected to the gas supply 21 via a suitable flow control valve (not shown). The collar is attached to a suitable support (not shown) which supports it at a selected level. The collar is sized so as to allow relative vertical and rotational movement of the silicon cylinder 10.

Since helium at a given temperature and pressure is lighter than air, helium will tend to escape from the gap at the top of the collar between the EFG cylinder and the collar (some minor losses of helium also tend to occur from the open bottom of the collar due to possible turbulence and mixing of air and helium). As shown in FIG. 3, the gap between the top of the collar and the cylinder is sealed by attaching a very soft and small pore foam rubber O-ring 22 to the inner edge of the collar. The ring is sized so as to touch the EFG tube with negligible pressure in order to avoid any force on the cylinder which would cause the cylinder to crack or otherwise be damaged. To prevent the passage of helium through the foam seal, a thin porous or perforated plastic tube 24 is embedded inside the O-ring as shown in FIG. 4. Tube 24 is connected to a water supply (not shown) via a suitable conduit (not shown) and a control valve (also not shown). A small amount of water is injected periodically into the O-ring via tube 24. The foam rubber of the O-ring 22 is porous and absorbs the water injected via tube 24. The water filling the foam rubber forms a meniscus between the surface of the cylinder and the O-ring that serves as a seal to prevent escape of helium.

For the purpose of easy insertion of the EFG tube 10 into the collar, a second elastic and resilient tube 26 made of plastic or rubber is embedded inside the O-ring. This plastic tube 26 is connected to means (not shown) for (a) partially evacuating it so as to cause the inner circumference of the seal to expand, or (b) pressurizing it with air to cause the inner circumference of the O-ring to shrink. To allow for insertion of the silicon cylinder into the collar, vacuum is applied to tube 26 so as to cause the O-ring to contract in cross-section while expanding its major diameter at its inner circumference. Thereafter, with the silicon cylinder surrounded by the O-ring, plastic tube 26 is pressurized with air or some other gas so as to cause the O-ring to expand in cross-section and contract its major diamter at its inner circumference so as to engage the silicon cylinder. The dimensional change in the foam rubber O-ring when contracted and expanded in this way is relatively slight, just enough to permit easy insertion of silicon tube 10 on expansion and to insure a good seal made by the O-ring on contraction. The collar also has a side window 28 made of glass or some other transparent material through which a laser beam can pass to cut wafers out of cylinder 10.

Figure 5:
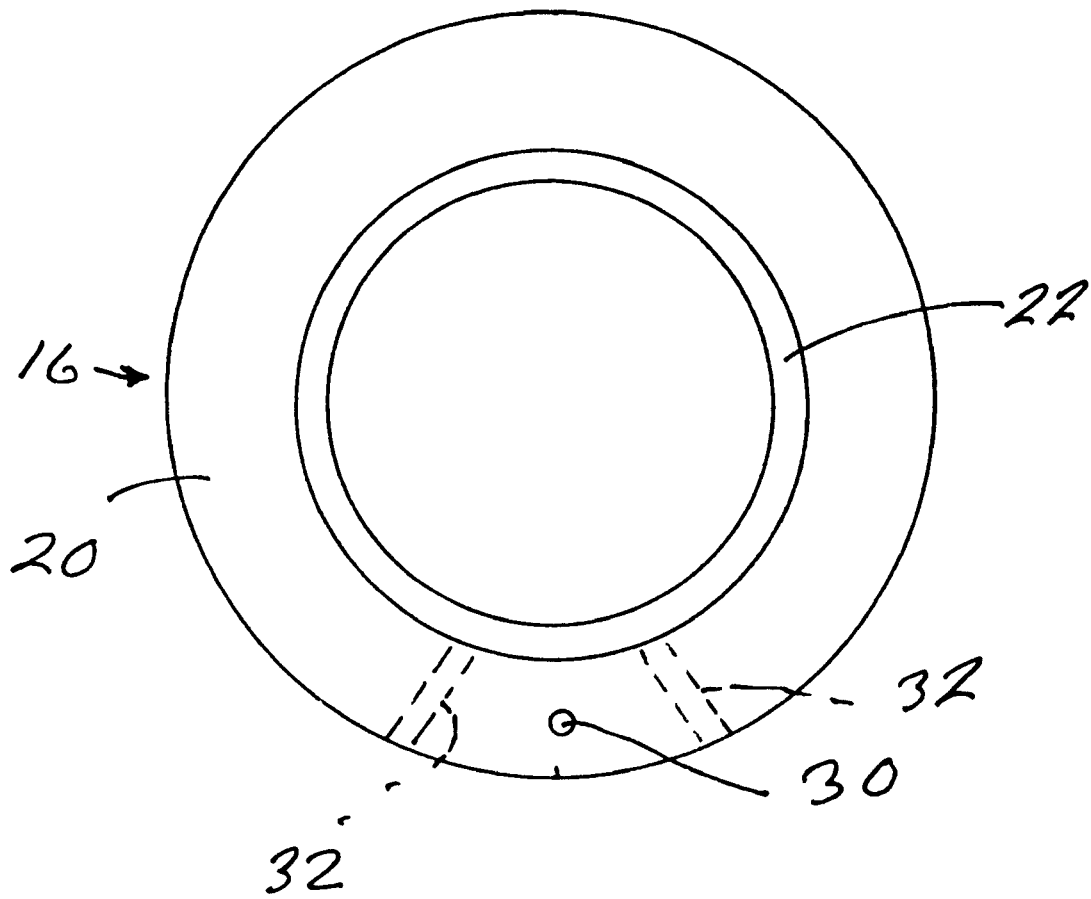
FIG. 5 is a plan view of a modification of the gas-confining collar.

FIG. 5 shows a modification of the foregoing apparatus. In this case the helium, or other noble gas or forming gas, is injected by tube 18 into the collar via an opening 30 in its top side directly above window 28, and two vertical wipers 32 made of soft foam rubber similar to that of the seal 22 are located inside the collar on both sides of the beam impact area, preferably immediately adjacent to the opposite side edges of the window as shown in FIG. 5. The wipers 32 serve to prevent helium from filling the entire annulus of the collar, thus reducing the quantity of helium required to flood the space in front of the portion of the silicon tube being cut by the laser beam. As a further optional measure, the wipers may be provided with embedded porous plastic tubes (not shown) like tube 24 that are connected to a water supply (not shown) via a suitable control valve (not shown) and serve to feed water to the wipers to keep them wet, thereby establishing a meniscus between the wipers and the silicon tube that acts to prevent escape of helium past the wipers.

Referring again to FIG. 2, the illustrated apparatus also includes a laser 34, relay lenses 36, 38, a 45° mirror 40, and a focusing cylindrical lens 42. The latter is mounted for rotation on its optical axis from one to the other of two different positions that are spaced from one another by an angle of 90 degrees. Lens 42 is rotatable on command by a lens-rotating mechanism (not shown). The mirror 40 directs the laser beam to the cylindrical lens, and the latter converts the beam into an elongated narrow spot pattern, e.g., a spot measuring about 300 μm×25 μm and focuses it through the glass window 28 onto the exterior surface of the silicon tube 10. Focusing the beam as an elongated narrow spot speeds up the cutting process and also permits better control of laser energy density. With the foregoing arrangement, cutting is achieved by generating vertical and horizontal cuts in the silicon cylinder 10 in rectangle or square patterns, thereby producing rectangular or square wafers.

Using the apparatus of FIG. 2, the preferred cutting process involves first positioning the cylindrical lens 42 in the first of its two different positions, in which position it will cause the beam from laser 34 to form a narrow elongated beam spot that is oriented with its long dimension extending parallel to the longitudinal axis of silicon tube 10. Then the laser is operated to cut in cylinder 10 a plurality of horizontally-spaced vertical cuts that commence at the bottom edge of the silicon tube. This first cutting action involves intermittent rotation of the silicon cylinder through 360 degrees so that the vertical cuts extend around the full circumference of the cylinder. Depending on the length of the beam spot, it may be necessary to move the entire laser cutting system vertically to achieve vertical cuts of the proper length. Alternatively lengthening the vertical cuts can be achieved by moving the silicon cylinder vertically. Once all the vertical cuts have been made, the cylindrical lens is rotated 90 degrees to its second position, in which position it focuses the laser beam so that its elongate beam spot is oriented with its long dimension extending horizontally, i.e., at a right angle to the axis of silicon cylinder 10. This horizontally-oriented laser beam spot is caused to traverse cylinder 10 horizontally between the vertical cuts so as to separate wafers from the cylinder. This can be achieved by rotating the silicon cylinder. Alternatively, it can be achieved by pivoting mirror 40 on a pivot axis that extends parallel to the silicon cylinder. Regardless of how the horizontal cuts are made, only one line of horizontal cuts is required to produce wafers, since the bottom edges of the wafers are portions of the bottom edge of the silicon cylinder.

It is contemplated that the need to use a cylindrical lens as described above can be eliminated by using other lasers and focusing the beam into a circular spot pattern, and using mechanical means to cause the laser to scan the surface of the silicon cylinder in a way that will result in square or rectangular wafers being cut out of the cylinder. Lasers, other than the one described above, with higher pulse repetition rates would be required for this application.

Other ways and means of using a laser to cut materials in a selected pattern are well known, as exemplified by the following U.S. Pat. No. 4,503,313, issued Mar. 5, 1985 to A. Tsutsumi; U.S. Pat. No. 4,675,501, issued Jun. 23, 1987 to H. Klingel; U.S. Pat. No. 4,728,771, issued Mar. 1, 1988 to F. Sartorio; U.S. Pat. No. 5,463,202, issued Oct. 31, 1995 to M, Kurosawa et al; U.S. Pat. No. 5,667,707, issued Sep. 16 1997; U.S. Pat. No. 5,756,961, issued May 26, 1998 to K Sato et al.; and U.S. Pat. No. 5,759,428, issued Jun. 2,1998 to H. Balamane et al. The teachings of those patents are included herein by reference.

An alternative apparatus and method of conducting cutting in a noble gas or forming gas environment involves the use of a gas assist laser nozzle. Gas assist nozzles are well known in the art and are exemplified by said U.S. Pat. No. 4,728,771 and also by U.S. Pat. No. 5,083,006, issued Jan. 21, 1992 to D. Stroud and U.S. Pat. No. 5,220,149, issued Jun. 15, 1993 to G. Neidhardt et al.

Figure 6:
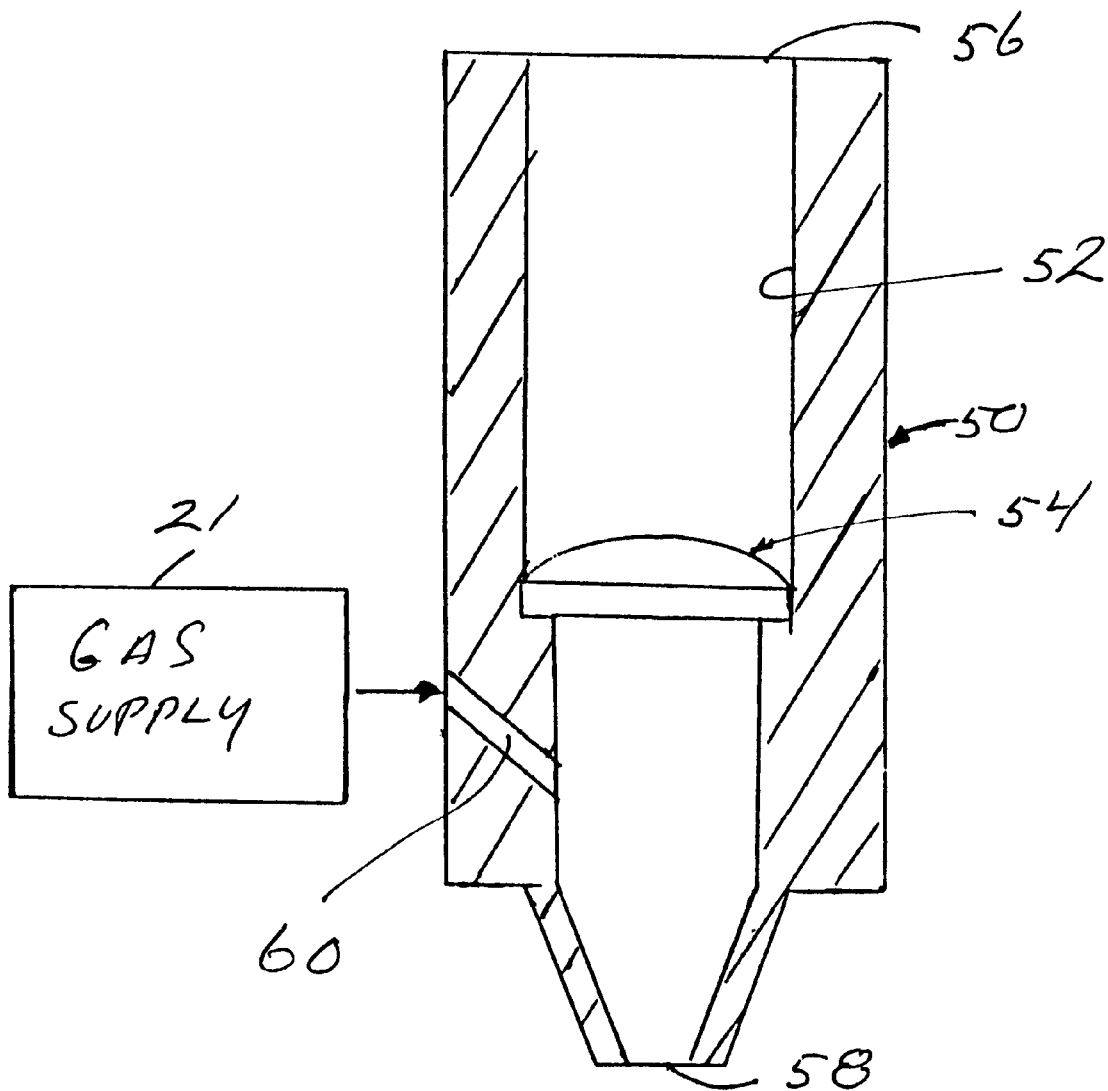
FIG. 6 illustrates a laser gas-assist nozzle constituting part of an alternative embodiment of the invention.

By way of example but not limitation, FIG. 6 schematically illustrates a gas assist nozzle 50. The nozzle has a central or axial bore 52 in which is mounted a focusing lens 54. Bore 52 is open at one end 56 for admittance of a laser beam from a laser (not shown) and has a reduced diameter discharge opening or orifice 58 through which the laser beam passes out of the nozzle. The lens 54 serves to focus the laser beam so that its focal plane is at the adjacent surface of the material to be cut which will be located close to the discharge orifice 58. One or more side ports 60 are provided in the nozzle for injection of assist gas from a gas supply 21. In this case the assist gas is a noble gas or forming gas as described above. The assist gas, which flows out of the discharge orifice 58 into contact with the material being cut, is introduced at a fluid pressure level which will cause it to flow out of the nozzle with a velocity sufficient to enhance the laser cutting speed by removing materials that tend to deposit as debris at the cut edges (in the cutting of silicon tubes, the debris consists primarily of re-deposition of silicon from the molten and vaporized states produced by the laser energy). Since the layer of debris promotes microcracks at the cut edges, the removal of debris by the assist gas not only enhances cutting speed but also improves the strength of the cut wafers. The stream of assist gas discharged from the nozzle spreads laterally along the surface of the silicon tube being cut, thereby creating a non-air ambient that envelops the adjacent surface portion of the tube.

Although the invention has been described in connection with a Nd:YAG laser, it is to be appreciated that the invention may be practiced using a different short pulse length pulse laser. It also is argued that laser cutting of silicon using a laser that produces relatively long length pulses, e.g., a Nd:YAG laser operating with a pulse length of 500 microseconds (μs), may be improved in terms of wafer quality, if not in increased cutting speed, by conducting the cutting in an ambient consisting of a noble gas or forming gas as taught by this invention. Although the Q-switched Nd:YAG laser has been described in the foregoing specification as operating at a pulse repetition rate of 50 Hz and a 10 ns duration, with an average power output of 65 watts, it is to be appreciated that the laser may be operated with different pulse repetition rates, pulse durations and average power output, according to the material being cut and the results intended to be achieved. Also, the spot size and shape of the laser beam focused on the material to be cut may be altered according to the type of laser used, the desired cutting speed, the pulse width, repetition rate, and energy density, and the composition and thickness of the material being cut. While a circular beam spot pattern may be used advantageously with other lasers and the present invention, an elongated narrow spot pattern is preferred for the purpose of maximizing cutting speed. Preferably the beam spot pattern is shaped so that the width of the cut made in the material being cut is in the order of microns. By way of example but not limitation, when using a short pulse Nd:YAG laser to cut silicon, it is preferred to use a narrow elongated beam spot having a maximum width in the range of 40–150 microns.

A further possible modification is to form the collar 16 so that its bottom side is closed off, i.e., so that in cross-section it consists of a top wall and a bottom wall connected by a side wall in the form of a "U" that is turned 90° on its side. It should be noted also that laser nozzles of different constructions may be used in practicing the invention.

Although FIG. 2 illustrates the invention as being applied to a cylinder rather than to a tube with a polygonal cross-section, e.g., an octagon, it is to be understood that the invention may be used to cut tubes of various cross-sectional configurations, e.g., eight-sided EFG-grown silicon tubes commonly identified simply as "octagons", particularly if an assist gas nozzle as shown in FIG. 6 is used rather than a collar as illustrated in FIGS. 2 and 3. It is to be understood also that if the EFG tubes to be cut have a polygonal cross-sectional configuration, a collar may still be used to provide a suitable noble gas or forming gas environment in the cutting zone, but in that case the collar will be constructed modified so that at its inner edge will have a mating polygonal configuration to provide a close fit with the tubes to be cut. It is to be noted that use of a collar is preferred over a gas assist nozzle since the latter would consume more of the forming gas or noble gas due to loss of gas to the outside atmosphere.

It also is contemplated that the gaseous environment provided by the present invention may consist or a mixture of noble gases or a mixture of forming gas and one or more noble gases. Also although xenon was not tested, it is believed that its use would provide the same improvement in results that are obtained with helium, neon, argon and krypton.

Although the invention has been described in connection with cutting silicon, it is believed that the concept of cutting a fragile crystalline material with a laser using a selected non-air ambient or environment may be used to cut other materials. Also the invention is not limited to cutting hollow tubes but may be used to cut silicon or other crystalline materials in sheet or other form, particularly materials having a relatively small thickness, e.g., a thickness in the range of 100 to 700 μm. Similarly, the apparatus used to support the silicon tubes and the construction of the laser system may be modified to use means well known or obvious to persons skilled in the art. Still other modifications will be obvious to persons skilled in the art from the foregoing description.

As used herein, the terms "laser beam" and "laser energy beam" is to be construed as including a stream of pulses of laser energy.

What is claimed is:

1. A method of cutting a hollow semi-conductor body of silicon into wafers for use in making solid state electronic devices, comprising cutting through said semi-conductor body with a short pulse laser in a vacuum or in a gaseous environment consisting substantially of one or more of the following gases: forming gas and noble gases.

2. A method according to claim 1 wherein substantially all of said gaseous medium comprises a noble gas.

3. A method according to claim 1 wherein substantially all of said gaseous medium consists of one or more of the following gases: forming gas, helium, argon, neon and krypton.

4. A method according to claim 1 wherein substantially all of said gaseous medium comprises helium.

5. A method according to claim 1 wherein substantially all of said gaseous medium comprises argon.

6. A method according to claim 1 wherein said cutting is accomplished using a Nd:YAG laser.

7. A method according to claim 6 wherein said laser has a 50 Hz pulse repetition rate.

8. A method according to claim 7 wherein said laser has a 10 ns pulse duration.

9. A method according to claims 1 wherein substantially all of said gaseous medium comprises one or more of the following gases: forming gas, helium, argon, neon, krypton, and xenon, and further wherein said laser is Nd:YAG laser that produces a laser beam having a pulse repetition rate in the order of 50 Hz and a pulse duration in the order of 10 ns.

10. A method according to claim 1 further including the steps of supporting said hollow body, and operating said laser so as to provide a laser beam that traverses said hollow body in selected horizontal and vertical paths so as to cut out rectangular wafers from said hollow body.

11. A method according to claim 1 wherein said silicon body has a wall thickness in the range of 100 to 700 μm.

12. A method of cutting a hollow semi-conductor body of silicon into wafers for use in making solid state electronic devices, comprising the steps of:

surrounding said semi-conductor body with a collar so as to define an annular space surrounding said body, injecting a gas consisting of one or more gases from the group consisting of forming gas and the noble gases He, Ne, Ar and Kr into said annular space; and cutting said semi-conductor body by means of a short pulse length laser that is operated so as to beam laser energy pulses through said annular space to said semi-conductor body, whereby laser cutting of said semi-conductor body is conducted in the presence of said gas.

13. A method according to claim 12 wherein said collar has a window that is transparent to laser energy, and further wherein said laser pulses are directed through said window at said semi-conductor body.

14. A method according to claim 12 wherein said hollow body has a thickness in the range of 100 to 700 μm.

15. A method of cutting a semi-conductor body comprising the steps of:

passing a laser energy beam through a gas assist nozzle so that said laser energy beam impinges upon and cuts through a selected portion of said semiconductor body; and simultaneously injecting a gas from the group consisting of forming gas and the noble gases He, Ne, Ar and Kr into said gas assist nozzle and discharging a stream of said gas from said nozzle concurrently with said laser energy beam, with said stream of gas being directed so as to contact said selected portion of said semiconductor body as said selected portion is being cut by said laser beam.

16. A method according to claim 15 wherein said laser energy beam is produced by a short pulse laser.

17. A method according to claim 16 wherein said laser is a Nd:YAG laser and said semi-conductor body is silicon.

18. A method according to claim 15 where said cutting is conducted so as to cut four-sided wafers out of said semiconductor body.

19. A method according to claim 15 wherein said hollow body has a thickness in the range of 100 to 700 $\mu$m.

20. A method of cutting a semi-conductor body comprising the steps of:

placing said body in a vessel having a window that is transparent to laser energy and evacuating said vessel so that said body is in an air-free environment; and passing laser energy beam through said window into said vessel to said semi-conductor body and causing said laser energy beam to traverse said semiconductor body so that said laser energy beam will cut out portions of said semiconductor body.

21. A method according to claim 20 wherein said laser energy beam is produced by a Nd:YAG laser and said beam operates to cut wafers out of said body.

22. A method according to claim 21 wherein said body is made of P-doped on.

23. A method according to claim 20 wherein said semiconductor body is made of silicon.

24. A method of cutting a hollow semi-conductor body of silicon into wafers for use in making solid state electronic devices, comprising the steps of:

using a short pulse laser to make a series of circumferentially-spaced first cuts in said semiconductor body, with said first cuts commencing at an end edge of said body and extending longitudinally of said body;

using a short pulse laser to make circumferentially-extending second cuts in said semiconductor body, with said second cuts intersecting said first cuts so as to separate a plurality of wafers from said body, characterized in that said first and second cuts are made in a gaseous environment consisting substantially of one or more of the following gases:

forming gas and noble gases.

25. A method according to claim 24 wherein said body has a wall thickness in the range of 100 to 700 $\mu$m and said laser is Nd:YAG laser.

26. A method according to claim 25 wherein said laser has a pulse duration in the order of 10 ns and a pulse repetition rate in the order of 50 Hz.

* * * * *